United States Patent
Dao et al.

(10) Patent No.: US 6,973,630 B1
(45) Date of Patent: Dec. 6, 2005

(54) SYSTEM AND METHOD FOR REFERENCE-MODELING A PROCESSOR

(75) Inventors: Tuan Dao, Richardson, TX (US); Seshagiri P. Kalluri, Richardson, TX (US); Shannon A. Wichman, McKinney, TX (US)

(73) Assignee: LSI Logic Corporation, Milpitas, CA (US)

(*) Notice: Subject to any disclaimer, the term of this patent is extended or adjusted under 35 U.S.C. 154(b) by 281 days.

(21) Appl. No.: 10/408,387

(22) Filed: Apr. 7, 2003

(51) Int. Cl.[7] ............................................. G06F 17/50
(52) U.S. Cl. ............................................. 716/1; 716/4
(58) Field of Search ........................................ 716/1, 4

(56) References Cited

U.S. PATENT DOCUMENTS

| | | | |
|---|---|---|---|
| 4,656,592 A | 4/1987 | Spaanenburg et al. | |
| 5,818,728 A | 10/1998 | Yoeli et al. | |
| 5,818,729 A | 10/1998 | Wang et al. | |
| 6,338,132 B1 * | 1/2002 | Kyker et al. | 712/211 |
| 6,347,395 B1 | 2/2002 | Payne et al. | |
| 6,459,136 B1 | 10/2002 | Amarilio et al. | |
| 6,597,664 B1 * | 7/2003 | Mithal et al. | 370/252 |
| 6,853,970 B1 * | 2/2005 | Gupta et al. | 703/20 |
| 2001/0034594 A1 * | 10/2001 | Kohno et al. | 703/14 |
| 2002/0152061 A1 * | 10/2002 | Shimogori et al. | 703/21 |
| 2002/0184602 A1 * | 12/2002 | Yokoyama et al. | 716/1 |
| 2004/0225867 A1 * | 11/2004 | Kyler et al. | 712/210 |
| 2005/0102596 A1 * | 5/2005 | Hekmatpour | 714/741 |

FOREIGN PATENT DOCUMENTS

| | | |
|---|---|---|
| JP | 01202397 | 7/2001 |
| JP | 02202886 | 7/2002 |

* cited by examiner

Primary Examiner—Stacy A. Whitmore
Assistant Examiner—Magid Y. Dimyan
(74) Attorney, Agent, or Firm—Hitt Gaines PC

(57) ABSTRACT

A system for, and method of, reference-modeling a processor design. In one embodiment, the system includes: (1) an architecture database that contains specifications regarding the processor design that include: instruction set specifications, architectural resource specifications, pipeline specifications and connectivity specifications, (2) a simulation subsystem that draws selected portions of the specifications to simulate and test the processor design and (3) a documentation subsystem that draws other selected portions of the specifications to document and register-model the processor design, changes in the specifications being propagated to the architecture database.

20 Claims, 6 Drawing Sheets

SYSTEM AND METHOD FOR REFERENCE-MODELING A PROCESSOR

TECHNICAL FIELD OF THE INVENTION

The present invention is directed, in general, to techniques for designing circuits and, more specifically, to a system and method for reference-modeling a processor.

BACKGROUND OF THE INVENTION

The ability to rapidly and accurately design a new processor architecture is becoming increasingly more important, especially as its complexity increases. Moore's law predicts that the number of active devices in an integrated circuit doubles about every 18 months. Therefore, a shorter time-to-market for a "proven" design often determines its success. New processor designs that are brought to market with even a small operational flaw are usually unacceptable and must be addressed with either a "patch" that circumvents the flaw or replaced if no such patch can be found. Either of these approaches may be costly as well as damaging to a company's reputation.

As processor performance requirements increase, the ability to test and verify a processor design becomes both more difficult and more critical to its success. Existing approaches to processor architecture development typically start with a rough idea for an architecture. A performance evaluation of the design is done manually using a set of benchmark applications, and a textual specification of the instruction set and architectural resources associated with the design is documented. Independently, a high-level instruction set simulator (ISS) is created to describe the architecture in an executable format. A set of tests is manually written based on the textual specification to provide some level of verification that the ISS does indeed represent the design architecture. Then, a register transfer level (RTL) model is constructed and the design is considered complete and ready for production.

Several problems are associated with this approach. Architecture reference behavior is often not completely defined and therefore unclear. Manual and unconnected steps (e.g., textual specification, ISS and RTL) inherently introduce and propagate human errors. Manual tests are time consuming and require visual inspection, thereby allowing for the introduction of more errors. Architectural changes at any representation level require that disparate data updates be "rippled" through for use by other models. Additionally, coherence between models is difficult to guarantee and often corrupts later design stages. Ensuring coherency between architectural representations is a time consuming and expensive effort. Architectural modifications or derivatives are difficult to add to the original models, and functional validation usually requires visual inspection and multiple iterations. Performance validation of the architecture is usually not automatically done and changes driven by performance considerations may not reliably be fed back into the architecture.

Accordingly, what is needed in the art is a way to integrate, unify and update independent processor design specifications that allows a comprehensive reference-modeling of the processor design.

SUMMARY OF THE INVENTION

To address the above-discussed deficiencies of the prior art, the present invention provides a system for, and method of, reference-modeling a processor design. In one embodiment, the system includes: (1) an architecture database that contains specifications regarding the processor design that include: instruction set specifications, architectural resource specifications, pipeline specifications and connectivity specifications, (2) a simulation subsystem that draws selected portions of the specifications to simulate and test the processor design and (3) a documentation subsystem that draws other selected portions of the specifications to document and register-model the processor design, changes in the specifications being propagated to the architecture database.

The present invention therefore introduces the broad concept of centralizing the specifications required for the various processes involved in processor design, evaluation and production into a single database such that the various processes are consistent and carried out more efficiently. Further, because the specifications are centralized, changes in the specifications are reflected in each of the processes.

In one embodiment of the present invention, the system further includes an assembler/compiler subsystem that draws further selected portions of the specifications to produce an assembler/compiler for the processor design. In another embodiment of the present invention, the system further includes a reference test suite section that draws further selected portions of the specifications to produce a reference test suite for the processor design. In still another embodiment of the present invention, the system further includes a performance analysis subsystem that draws further selected portions of the specifications to analyze a performance of the processor design. In an embodiment to be illustrated and described, the performance analysis subsystem instigates changes in the specifications which, in turn, affects the performance of the processor design. In this manner, optimization of processor performance becomes iteratively automated.

In one embodiment of the present invention, the instruction set specifications include specifications selected from the group consisting of: (1) instruction format, (2) field format, (3) opcodes and (4) operands. In another embodiment of the present invention, the architectural resource specifications include specifications selected from the group consisting of: (1) resource format, (2) function unit resources, (3) register resources and (4) memory resources. In still another embodiment of the present invention, the pipeline specifications include specifications selected from the group consisting of: (1) pipeline format and (2) stage description.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
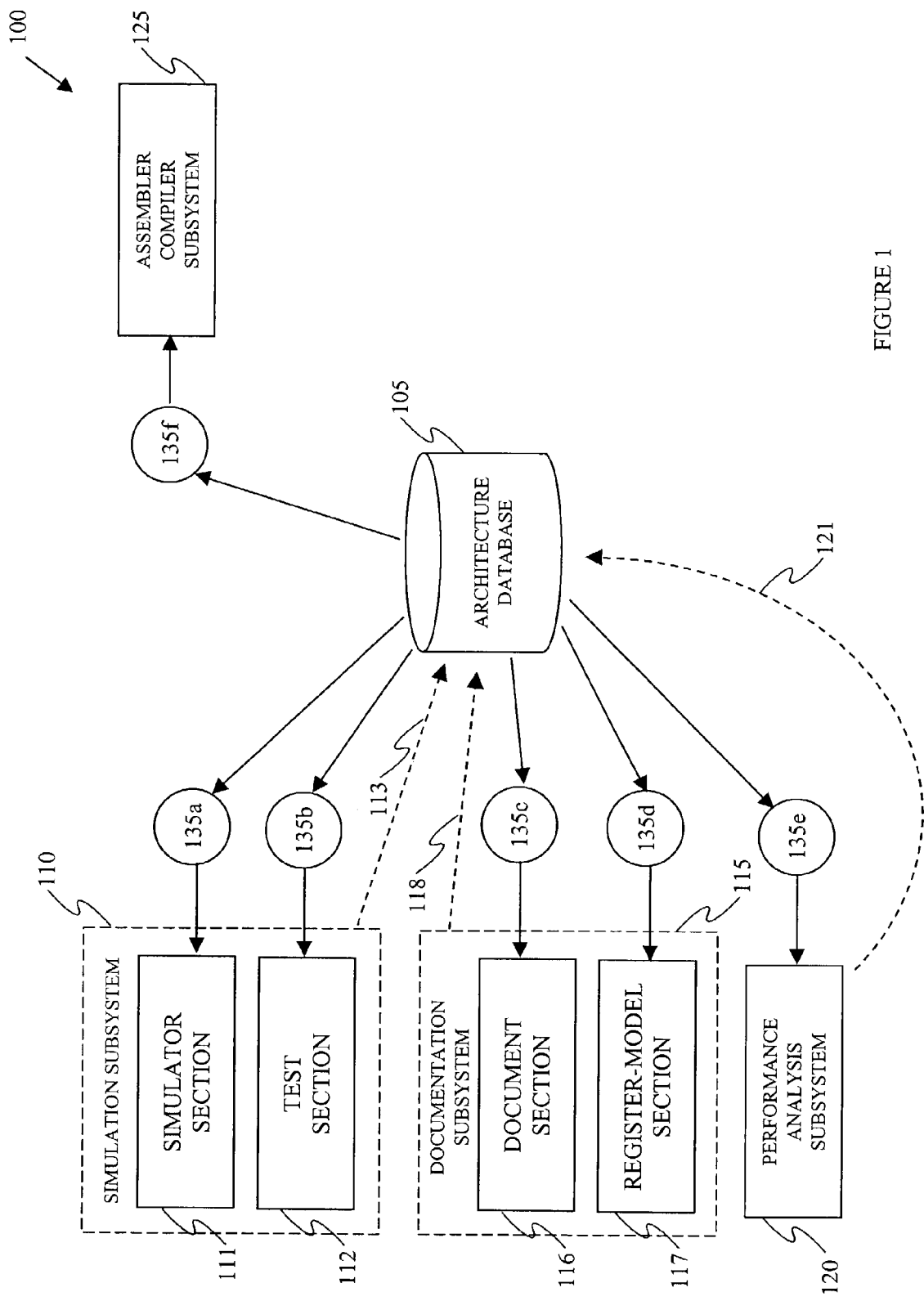
FIG. 1 illustrates a system diagram of an embodiment of a system for reference-modeling a processor design constructed in accordance with the principles of the present invention.

Referring initially to FIG. 1, illustrated is a system diagram of an embodiment of a system for reference-modeling a processor design, generally designated 100, constructed in accordance with the principles of the present invention. The system 100 includes an architecture database 105 having associated processor design specifications, a simulation subsystem 110, a documentation subsystem 115, a performance analysis subsystem 120, an assembler/compiler subsystem 125 and a collection of generator tools 135a–135f. The simulation subsystem 110 includes a simulator section 111 and a test section 112. The documentation subsystem 115 includes a document section 116 and a register-model section 117.

The illustrated embodiment of the present invention introduces the broad concept of centralizing the specifications required for the associated processes involved in a processor design, evaluation and production into the single architecture database 105. Appropriate dimensions of processor architecture specifications, associated with the processor design, may be sufficiently described and maintained in the architecture database 105 in a format from which a "correct-by construction" processor model and processor related tools may be constructed.

Since the specifications are centralized, the various processes may employ consistent data resulting in a more efficient and effective overall design execution. Additionally, changes in the centralized specifications may be consistently reflected in each of the processes. A key characteristic of the architecture database 105 is its modularity wherein specifications that provide four orthogonal dimensions regarding the processor design are contained. The four orthogonal dimensions include instruction set specifications, architectural resource specifications, pipeline specifications and connectivity specifications.

The simulation subsystem 110 draws selected portions of these specifications to simulate and test the processor design. The simulation subsystem 110 employs simulator and test generator tools 135a, 135b to obtain these selected portions of the specifications from the architecture database 105 and instigates specification changes dictated by simulation results to the architecture database 105 via a simulation change path 113. The simulation change path 113 may be a manual process that systematically facilitates a required specification change in the architecture database 105. Alternatively, the simulation change path 113 may be an automated process that provides a required update to a specification in the architecture database 105 based on simulator or test results.

In the illustrated embodiment, the simulator section 111 may be an ISS C-model that is used to construct an operational model in software from the architecture database 105 for the intended processor design. The ISS C-model employs selected portions of the specifications in the architecture database 105 to accomplish this software model, which may be an emulation of the intended processor hardware design to demonstrate instruction functionality. The simulator software model allows a virtual representation of registers, memory space, execution units, etc., that may then be run on existing hardware for testing purposes. A cycle-accurate ISS C-model may be provided although one that operates at less than intended clock speeds is also useful. Generally, the ISS C-model may not employ pipeline information. Also, a proven C-model may be used to begin writing application software to shorten a time-to-market cycle.

The simulator generator tool 135a draws selected portions of the specifications from the architecture database 105 and converts these definitions into a format that the simulator section 110 may use. A commercially available tool (e.g., Synopsis, CAE+, Afterburner or Synergy Sys) may be employed, or a proprietary generator tool may be developed, as appropriate.

The test section 112 includes a reference test suite section that draws selected portions of the specifications to produce a reference test suite for the processor design. The reference test suite is responsible for testing every permutation of every instruction in a straight-forward manner. The reference test suite may not test interactions between combinations of instructions or discern a problem involving a memory latency, for example. However, other portions or sections of the test section 112 may test for these interactions and general latencies.

The test generator tool 135b draws on the instruction set specifications for a selected architecture of the processor design and provides a test format to the test section 112 that allows an execution of an instruction to determine if a correct result is obtained. The test generator tool 135b may look at an instruction and determine the number of forms of the instruction (e.g., a register-to-register addition may be one of the forms of an addition instruction) that needs to be addressed for testing. Typically, the test generator tool 135b may be a proprietary design since an instruction set may have unique or proprietary features. For example, salient attributes of a proprietary test generator tool 135b may be directed toward an instruction set, assembly syntax, pipeline information for determining dependency conflicts and resources required by a given instruction.

The documentation subsystem 115 draws other selected portions of the specifications to document and register-model the processor design. This process employs document and register-model generator tools 135c, 135d to obtain these other selected portions from the architecture database 105 and instigates specification changes dictated by documentation results to the architecture database 105 via a documentation change path 118. As was discussed with respect to the simulation change path 113, the documentation change path 118 may be either a manual process that systematically facilitates a required specification change, or an automated process that provides a required update to a specification in the architecture database 105 based on document or register-model results.

The document section 115 produces a reference document of the instructions and their syntax, so that a programmer may know what the processor may be instructed to do. TABLE 1 is an example of a documentation output describing the instruction for generating an absolute value having extended precision.

TABLE 1

| ABS.E | Absolute Value (Extended Precision) | | | | | | |
|---|---|---|---|---|---|---|---|
| Assembly Syntax: | abs.e rX.e, rY.e | | | | | | |
| Description: | {r(X + 1):rX} = |{r(Y + 1):rY| The absolute value of the contents of a register pair {r(Y + 1):rY} is computed and placed in the register pair {r(X + 1) : rX}. In the corner case where the contents of rY.e = 0x8000:0000, the absolute value is calculated to be 0x7fff:ffff. | | | | | | |
| HW Flags: | v | gv | sv | gsv | c | ge | gt | z |
|  | x | — | x | — | 0 | x | x | x |
| Fmode Bits: | rez | sat | q15 | sre | mre | | | |
|  | — | — | — | — | — | | | |
| Instruction Word | 4-bit major opcode | 4-bit minor opcode | 4-bit STC/Dest operand | 4-bit source operand | | | |
| Resource Usage: | (ALU0 and ALU1) MAU0, or MAU1 | | | | | | |

Similarly, an architecture instruction set document may be generated as a manual that documents each of the instructions.

The document generator tool 135c draws information from the architecture database 105 regarding all of the instructions, their operands, and syntax thereby allowing the document section 115 to generate the instruction set architecture document as a word document. The document generator tool 135c may typically be a proprietary design that allows the appropriate specifications of the architecture database 105 to be assimilated or transformed into a format employable by the document section 115. Salient attributes of a proprietary document generator tool 135c may be directed toward an instruction set, assembly syntax, a functional description (C-code), instruction encoding and mode and flag information. For example, for each instruction in the architecture database 105{ extract assembly mnemonic and syntax
    extract allowable operands associated with instruction
    extract binary opcode
    extract functional description extract flag information

}

The register-model section 117 also renders other selected portions of the specifications to create a register transfer level (RTL) implementation of the processor design. The register-model section 117 provides an RTL model wherein the compete processor design may be split into groups of bits representing registers, and a flow of information between these registers is considered for each clock cycle. The RTL model may be considered to be a map of the hardware or silicon structure for the processor design that allows a "cycle accurate simulation" of the design. The register-model generator tool 135d may be considered to be a silicon compiler employing a software language (e.g., Verilog or VHDL) wherein the appropriate specifications are converted into an equivalent register and logic format that may be implemented.

The performance analysis subsystem 120 draws further selected portions of the specifications to analyze a performance of the processor design and instigates specification changes dictated by performance analysis results to change the performance of the processor design. A performance analysis generator tool 135e may be employed to obtain the further selected portions of the specifications, and necessary specification changes to the architecture database 105 may be provided via a performance change path 121. As before, the performance change path 121 may be a manual or an automated process that provides a required update to a specification.

The performance analysis subsystem 120 may be coupled to the ISS C-model employed by the simulate section 110 and the RTL model employed by the register-model section 117. The performance analysis subsystem 120 thereby allows processor software and hardware models to be tested employing benchmarks. Additionally, the performance of the processor design may be optimized for a particular application. For example, a processor design may be required to optimally perform a certain suite of application software. The performance analysis subsystem 120 would typically compile the types and occurrences of the required instructions to run the application software. Then, an execution speed vs. cost trade-off for the processor design may be determined between employing silicon real estate and using microcode instructions. The performance analysis generator tool 135e may typically be a proprietary design. As an example, to determine medium access control (MAC) throughput:

(1) extract a number of MAC resources, and
    (2) determine a number of cycles required between dependent MAC operations.

Therefore, if there is one MAC and it is a single cycle MAC that forwards its output directly to its input, it may be inferred that the MAC throughput is one MAC/cycle.

The assembler/compiler subsystem 125 draws further selected portions of the specifications to produce an assembler/compiler for the processor design. The assembler/compiler subsystem 125 allows a programmer to generate programming instructions for the processor design in a language that is higher-order than machine code, which is typically particular to the processor design. The assembler/compiler subsystem 125 may employ an assembler/compiler generator tool 135f. The assembler/compiler generator tool 135f allows a construction of the assembler/compiler subsystem 125 and may be readily available (e.g., GCC, GNU, ACE, etc.) or of a proprietary design.

Figure 2:
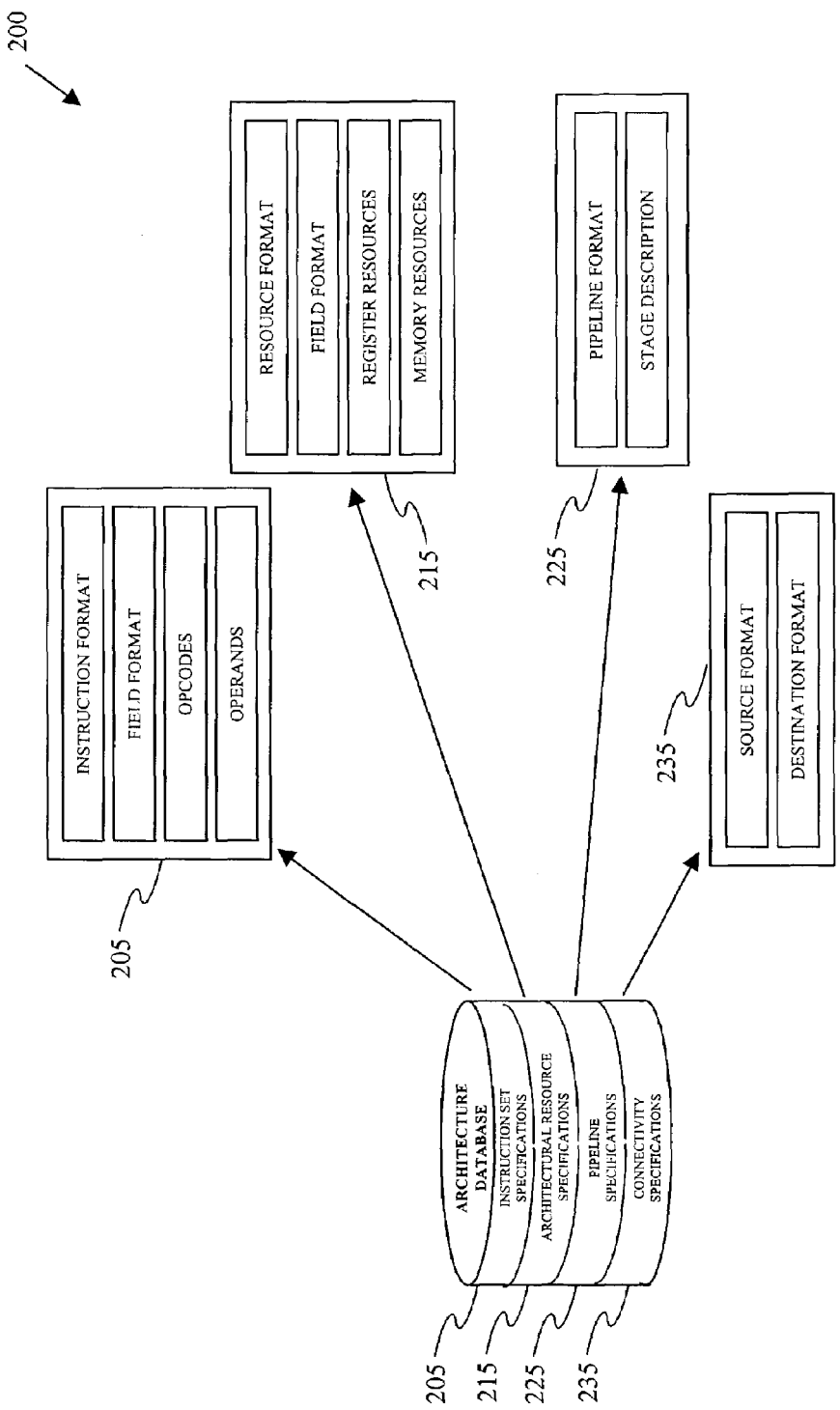
FIG. 2 illustrates a diagram of an embodiment of an architecture database showing four orthogonal sets of specifications and their related components.

Turning now to FIG. 2, illustrated is a diagram of an embodiment of an architecture database, generally designated 200, showing four orthogonal sets of specifications and their related components. The architecture database 200 includes instruction set specifications 205, architectural resource specifications 215, pipeline specifications 225 and connectivity specifications 235. The orthogonality and modularity of these sets facilitate the mixing and combining of modules to examine the performance characteristics of different architectures. For example, an instruction set description module may be mapped into different length pipelines or resource modules with a varying number of execution units.

The instruction set specifications 205 include the components of instruction format, field format, opcodes and operands. The instruction set specifications 205 describe all of the possible operations that the architecture may perform, the available operands for each operation and the functionality of each operation with respect to the operands.

Figure 3:
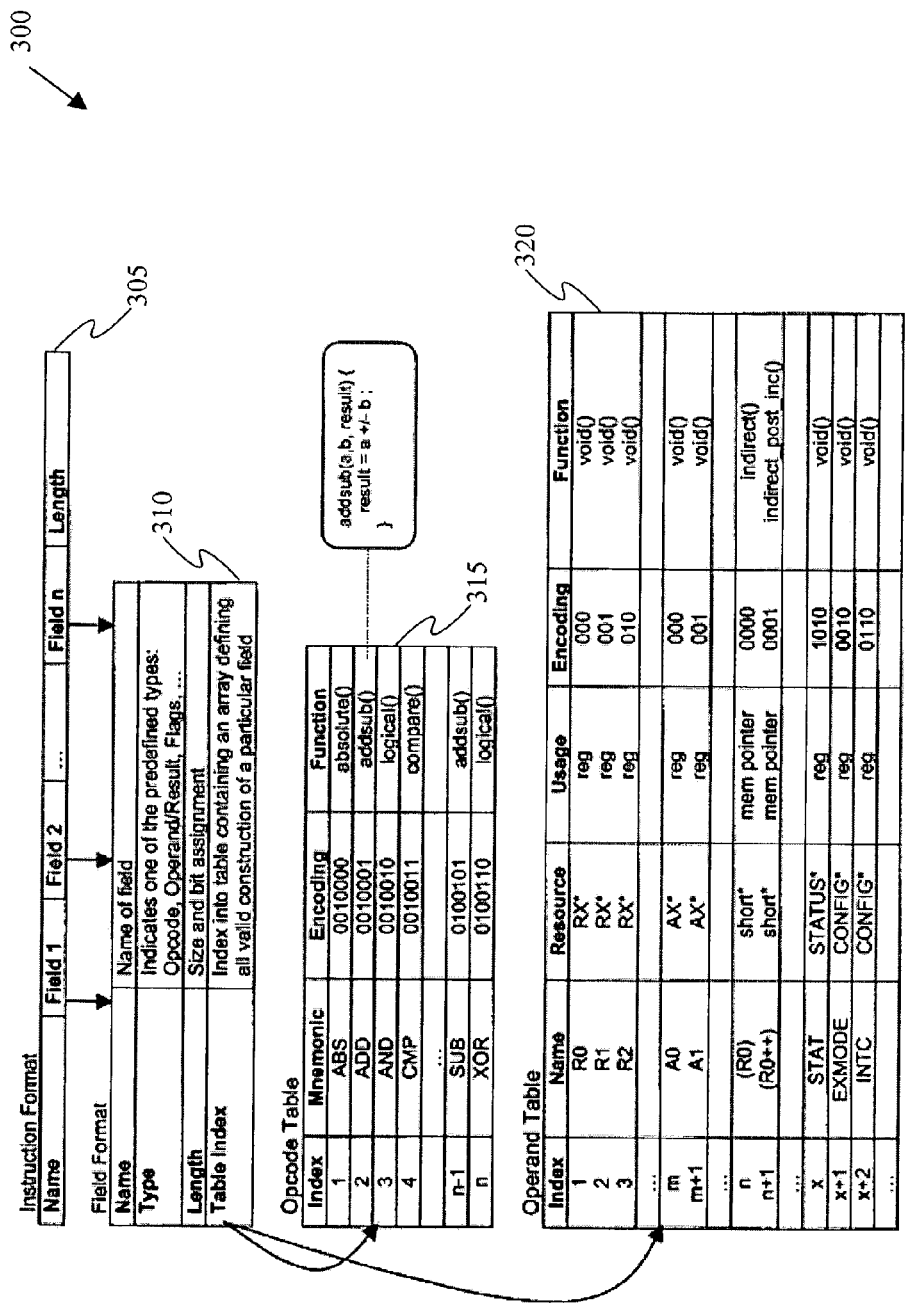
FIG. 3 illustrates a relationship diagram of an embodiment of components associated with instruction set specifications constructed in accordance with the principles of the present invention.

Turning momentarily to FIG. 3, illustrated is a relationship diagram of an embodiment of components associated with instruction set specifications, generally designated 300, constructed in accordance with the principles of the present invention. The instruction set specifications 300 include an instruction format 305, a field format 310, an opcode table 315 and an operand table 320, which represent an exemplary embodiment of an instruction set dimension of an architectural database. Of course, a greater or fewer number of tables may be required depending on the instruction set being defined. The tables are described in terms of C/C++ data structures. Each format has a unique name and a number of field pointers that point to structures that define each field of the format.

Generally, each table contains an opcode field and a number of operand fields (however, some opcodes have no operands). An opcode field pointer may point to an opcode definition structure that would define a length and a number of allowable opcodes for that particular instruction format. The allowable opcodes may be indexes into a primary opcode table that defines all of the operations associated with the architecture. This opcode table defines all instructions as well as their mnemonic, encoding and function. The function definition defines, in a somewhat generic manner, the details of the operation. These descriptions are used by other, downstream tools to extract the architecture simulator behavior, the RTL execution unit behavior, the programmer manual documentation and to ensure consistency between them.

A similar series of structures are used to fully define the operand fields of the formats, eventually pointing to the primary operand table 320. Note that this table contains pointers to a table in the resource dimension of the architecture database (such as the architectural resource specifications 215 of the architecture database 200 shown in FIG. 2) since operands usually refer to resources defined by the architecture. For operands that are used as addressing pointers, functions are provided to indicate how the address is formed, and what architecture updates are performed.

Returning again to FIG. 2, the architectural resource specifications 215 include the components of resource format, field format, register resources and memory resources. The architectural resource specifications 215 specifies the available resources of the architecture and defines their respective functionality, usage and access rules. Some of these resources include memory, registers, execution units and load/store/addressing units.

Figure 4:
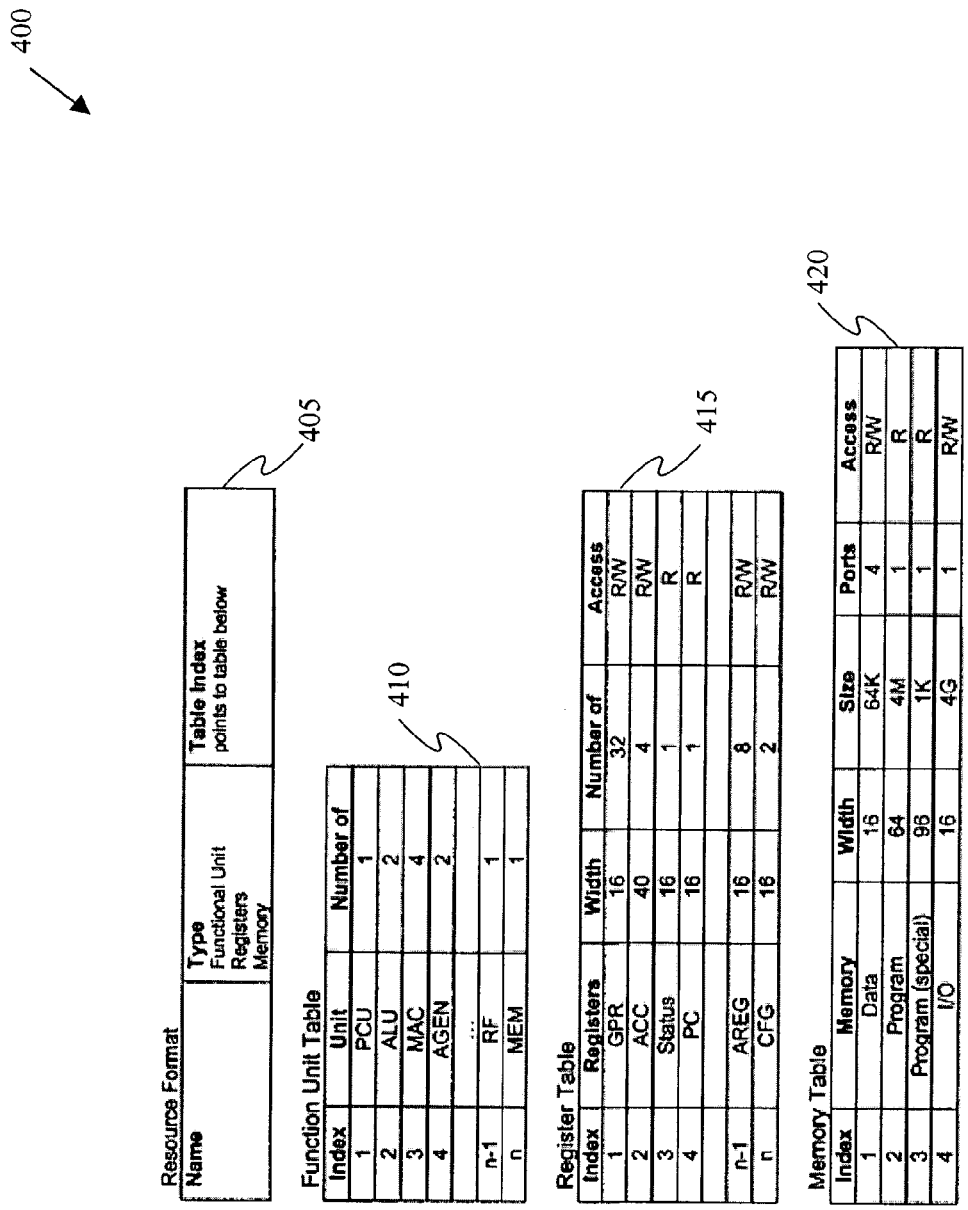
FIG. 4 illustrates a relationship diagram of an embodiment of components associated with architectural resource specifications constructed in accordance with the principles of the present invention.

Turning momentarily to FIG. 4, illustrated is a relationship diagram of an embodiment of components associated with architectural resource specifications, generally designated 400, constructed in accordance with the principles of the present invention. The architectural resource specifications 400 includes a resource format 405, a function unit table 410, a register table 415 and a memory table 420. Recall that in the instruction set module, references to architecture resources such as register and memory were made. However, the specification of how many registers or the size of memory is done here in the architectural resource specifications 400. This allows a processor architect to vary the resources to determine how they affect the performance of the processor architecture.

Returning again to FIG. 2, the pipeline specifications 225 include the components of pipeline format and stage description. The pipeline specifications 225 define the stages of a pipeline or pipelines associated with all operations of the processor. They also detail the functionality associated with each stage, which resources are read and written, which operations are calculated and completed and when resources are active.

Figure 5:
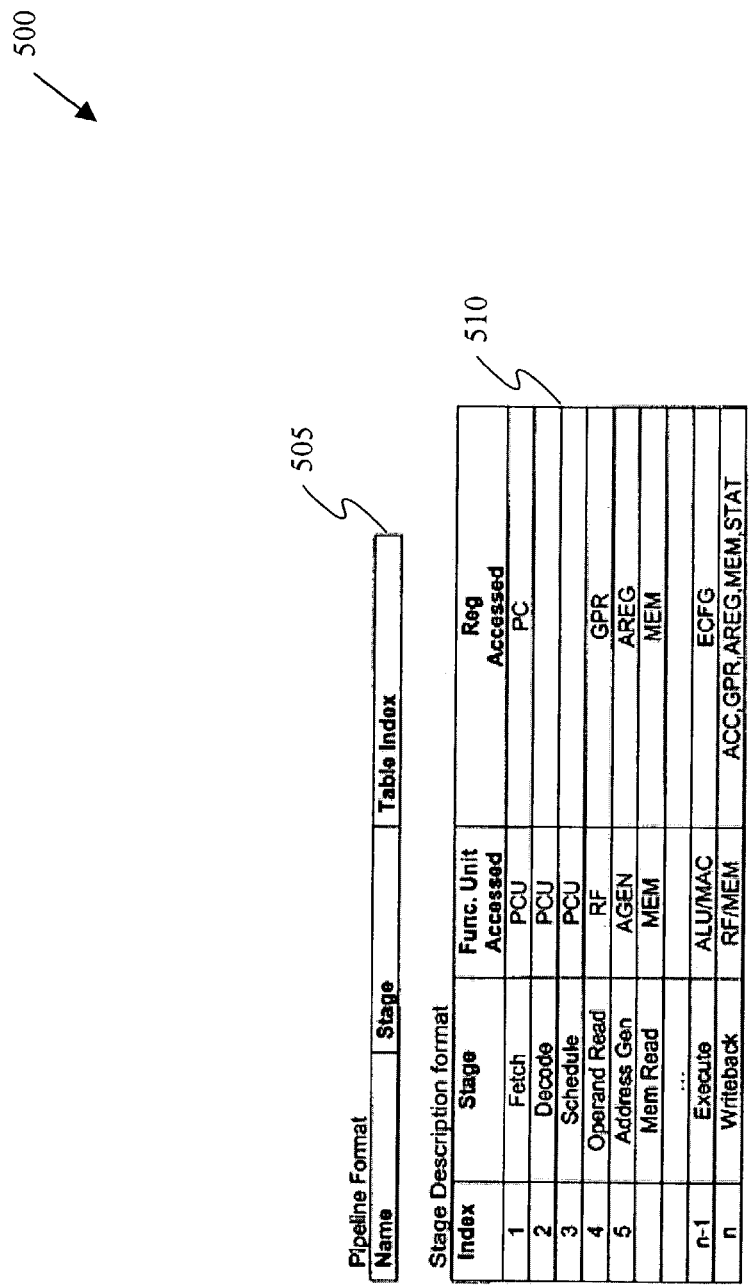
FIG. 5 illustrates a relationship diagram of an embodiment of components associated with pipeline specifications constructed in accordance with the principles of the present invention.

Turning momentarily to FIG. 5, illustrated is a relationship diagram of an embodiment of components associated with pipeline specifications, generally designated 500, constructed in accordance with the principles of the present invention. The pipeline specifications 500 include a pipeline format 505 and a stage description 510 and describe how a processor architecture is partitioned into pipeline stages. The description format is similar to that associated with the instruction set specifications 300 and the architectural resource specifications 400 discussed with respect to FIGS. 3 and 4, above.

Returning again to FIG. 2, the connectivity specifications 235 include the components of source format and destination format. The connectivity specifications 235 pull everything together by defining the connectivity of the architectural resources. This dimension defines the parameters from which data flow and bandwidth information may be extracted.

Figure 6:
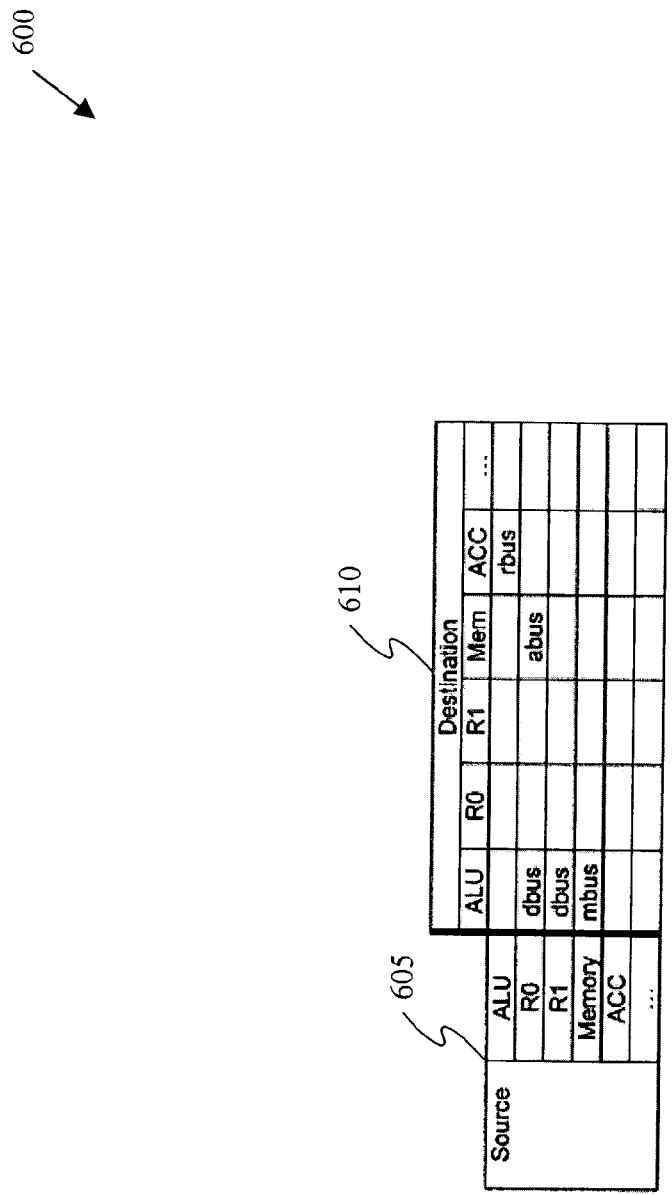
FIG. 6 illustrates a relationship diagram of an embodiment of components associated with connectivity specifications constructed in accordance with the principles of the present invention.

Turning momentarily to FIG. 6, illustrated is a relationship diagram of an embodiment of components associated with connectivity specifications, generally designated 600, constructed in accordance with the principles of the present invention. The connectivity specifications 600 include a source format 605 and a destination format 610. The connectivity specifications 600 describe how resources defined in an architectural resource specification are connected. The architectural resource specifications and the connectivity specifications may be described such that data and control flow are clear to tools that analyze the operation descriptions of the instruction set specifications. The format of the description may be explained using FIG. 6. Alternatively, a series of tables for each resource may be employed.

As an example, consider the operation:

$ACC = *R0 + R1,$ where ACC is an accumulator in an ALU, R0 and R1 are general purpose registers and *R implies an indirect memory access. The connectivity specifications 600 for this example, shown in FIG. 6, may be seen to include the quantities:

ALU: describes an ALU with two sources, an adder and a result,

R0, R1: defines general purpose first and second registers, dbus: describes a data bus, abus: describes an address bus, mbus: describes a memory data bus for read data, and rbus: describes a result bus from ALU.

FIG. 6 is not meant to indicate a complete description of an architecture, but may be used to demonstrate the connectivity between resources required to execute an operation used in the example. FIG. 6 indicates that the first register R0 and the second register R1 can drive the ALU via the data bus dbus. The data stored in the first register R0 and the second register R1 can also drive the memory via the address bus abus. The memory data may be sent to the ALU on the memory data bus mbus. And, the ALU result may be written to an accumulator ACC on the result bus rbus. Data from the pipeline module associated with an architecture database may be used in conjunction with the connectivity specifications 600 to determine the busses that are active for the pipeline stages.

In summary, embodiments of a system and method of reference-modeling a processor design have been provided that employ an architecture database having processor specifications in the four orthogonal dimensions or sets of instruction set specifications, architectural resource specifications, pipeline specifications and connectivity specifications. The architecture database integrates these specifications that otherwise may be desperate. Advantages of the invention include modularity and the correct-by-construction approach, illustrated by the embodiments. These advantages allow the major architecture models to use specifications that are generated from the same source thereby reducing verification efforts. Additionally, third-party tools may be generated using the same source. Benefits include fewer design mistakes and a typically shorter time-to-market for a processor design.

Although the present invention has been described in detail, those skilled in the art should understand that they can make various changes, substitutions and alterations herein without departing from the spirit and scope of the invention in its broadest form.

What is claimed is:

1. A system for reference-modeling a processor design, comprising:
    an architecture database that contains specifications regarding said processor design that include: instruction set specifications, architectural resource specifications, pipeline specifications and connectivity specifications;
    a simulation subsystem that draws selected portions of said specifications to simulate and test said processor design; and
    a documentation subsystem that draws other selected portions of said specifications to document and register-model said processor design, wherein changes to said documented specifications are propagated to said architecture database.

2. The system as recited in claim 1 further comprising a performance analysis subsystem that draws further selected portions of said specifications to analyze a performance of said processor design.

3. The system as recited in claim 1 further comprising an assembler/compiler subsystem that draws further selected portions of said specifications to produce an assembler/compiler for said processor design.

4. The system as recited in claim 1 wherein said simulation subsystem comprises a reference test suite section that draws selected portions of said specifications to produce a reference test suite for said processor design.

5. The system as recited in claim 1 wherein said instruction set specifications include specifications selected from the group consisting of:
    instruction format,
    field format,
    opcodes, and
    operands.

6. The system as recited in claim 1 wherein said architectural resource specifications include specifications selected from the group consisting of:
    resource format,
    function unit resources,
    register resources, and
    memory resources.

7. The system as recited in claim 1 wherein said pipeline specifications include specifications selected from the group consisting of:
    pipeline format, and
    stage description.

8. A method of reference-modeling a processor design, comprising:
    storing specifications regarding said processor design in an architecture database, said specifications including: instruction set specifications, architectural resource specifications, pipeline specifications and connectivity specifications;
    drawing selected portions of said specifications to simulate and test said processor design; and
    drawing other selected portions of said specifications to document and register-model said processor design, wherein changes to said specifications are propagated to said architecture database.

9. The method as recited in claim 8 further comprising drawing further selected portions of said specifications to analyze a performance of said processor design.

10. The method as recited in claim 8 further comprising drawing further selected portions of said specifications to produce an assembler/compiler for said processor design.

11. The method as recited in claim 8 wherein drawing selected portions of said specifications comprises producing a reference test suite for said processor design.

12. The method as recited in claim 8 wherein said instruction set specifications include specifications selected from the group consisting of:
    instruction format,
    field format,
    opcodes, and
    operands.

13. The method as recited in claim 8 wherein said architectural resource specifications include specifications selected from the group consisting of:
    resource format,
    function unit resources,
    register resources, and
    memory resources.

14. The method as recited in claim 8 wherein said pipeline specifications include specifications selected from the group consisting of:
    pipeline format, and
    stage description.

15. A system for reference-modeling a processor design, comprising:
    an architecture database that contains specifications regarding said processor design that include: instruction set specifications, architectural resource specifications, pipeline specifications and connectivity specifications;
    a simulation subsystem that draws selected portions of said specifications to simulate and test said processor design;
    a documentation subsystem that draws other selected portions of said specifications to document and register-model said processor design, wherein changes to said documented specifications are propagated to said architecture database; and
    a performance analysis subsystem that draws further selected portions of said specifications to analyze a performance of said processor design and instigate changes in said specifications thereby to change said performance.

16. The system as recited in claim 15 further comprising an assembler/compiler subsystem that draws further selected portions of said specifications to produce an assembler/compiler for said processor design.

17. The system as recited in claim 15 wherein said simulation subsystem comprises a reference test suite section that draws selected portions of said specifications to produce a reference test suite for said processor design.

18. The system as recited in claim 15 wherein said instruction set specifications include specifications selected from the group consisting of:
- instruction format,
- field format,
- opcodes, and
- operands.

19. The system as recited in claim 15 wherein said architectural resource specifications include specifications selected from the group consisting of:
- resource format,
- function unit resources,
- register resources, and
- memory resources.

20. The system as recited in claim 15 wherein said pipeline specifications include specifications selected from the group consisting of:
- pipeline format, and
- stage description.

* * * * *